US009097755B2

(12) United States Patent
Dmitriev-Zdorov

(10) Patent No.: US 9,097,755 B2
(45) Date of Patent: Aug. 4, 2015

(54) GENERATING TRANSMISSION-CODE COMPLIANT TEST SEQUENCES

(71) Applicant: Mentor Graphics Corporation, Wilsonville, OR (US)

(72) Inventor: Vladimir B. Dmitriev-Zdorov, Longmont, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/781,676

(22) Filed: Feb. 28, 2013

(65) Prior Publication Data

US 2013/0275074 A1    Oct. 17, 2013

Related U.S. Application Data

(63) Continuation of application No. 11/880,354, filed on Jul. 19, 2007, now abandoned.

(60) Provisional application No. 60/927,163, filed on May 1, 2007.

(51) Int. Cl.
*G01R 31/28* (2006.01)
*G01R 31/3183* (2006.01)

(52) U.S. Cl.
CPC ........ *G01R 31/28* (2013.01); *G01R 31/318357* (2013.01)

(58) Field of Classification Search
CPC ................. G01R 31/28; G01R 31/318357
USPC ........................... 702/57, 117, 119
See application file for complete search history.

(56) References Cited

U.S. PATENT DOCUMENTS

| 6,920,402 | B1 * | 7/2005 | Liaw et al. ...................... 702/57 |
| 7,308,620 | B1 * | 12/2007 | Talbot ........................... 714/707 |
| 7,336,749 | B2 * | 2/2008 | Garlepp ........................ 375/355 |
| 2003/0093715 | A1 * | 5/2003 | Hasako et al. .................. 714/25 |
| 2004/0008024 | A1 * | 1/2004 | Miller ........................ 324/158.1 |
| 2004/0221143 | A1 * | 11/2004 | Wise et al. ..................... 712/300 |
| 2006/0009931 | A1 * | 1/2006 | Smith et al. ..................... 702/58 |
| 2006/0158225 | A1 * | 7/2006 | Stojanovic et al. ............. 326/87 |

(Continued)

FOREIGN PATENT DOCUMENTS

WO    2008137458    11/2008

OTHER PUBLICATIONS

Bhatti et al., "2 Obps SerDes Design Based on ilM Cu-11 (130nm) Standard Cell Technology," OLSVLSI'06, pp. 198-203 (Apr. 30-May 2, 2006).

(Continued)

*Primary Examiner* — Janet Suglo

(57)    ABSTRACT

Disclosed herein are exemplary methods, apparatus, and systems for generating test sequences that can be used to evaluate high-speed circuit pathways. The disclosed methods, apparatus, and systems can be used, for example, in a printed circuit board or integrated circuit design flow to analyze signal integrity or other electrical behavior. For example, in one exemplary embodiment, a sequence of code words to be input on a circuit channel is determined in a nonrandom manner. In this embodiment, the sequence of code words complies with a transmission code (for example, the 8b10b transmission code) and is designed to cause the output voltage of the channel to be reduced during a time period in which the channel outputs a logic high value.

20 Claims, 11 Drawing Sheets

(56) References Cited

U.S. PATENT DOCUMENTS

| | | |
|---|---|---|
| 2007/0006150 A9 | 1/2007 | Walmsley |
| 2008/0273584 A1 | 11/2008 | Dmitriev-Zdorov |

OTHER PUBLICATIONS

Carer, "Effective Techniques for SERDES Channel Design," User2User 2006, 22 pp. (May 2006).

Casper et al., "An Accurate and Efficient Analysis Method for Multi-Ob/s Chip-to-chip Signaling Schemes," Symp. on VLSI Circuits Digest of Technical Papers, pp. 54-57 (Jun. 2002).

Casper, "Peak Distortion ISI Analysis," Intel Corporation PowerPoint Presentation, 39 pp. (downloaded on Mar. 16, 2007).

Hancock, "Identifying Sources of Jitter," Euro DesignCon 2004, 20 pp. (Oct. 2004).

International Search Report dated Oct. 30, 2008, from International Application No. PCT/US08/62023.

Kiwimagi et al., "Worst-Case Pattern Evaluation of Baseband Channels," IBM J. Res. Develop., pp. 340-349 (Jul. 1977).

Maxim, "An Introduction to Jitter in Communications Systems," downloaded from http://www.maxim-ic.com/appnotes.cfm/an_pk/1916, 6 pp. (document marked Mar. 6, 2003).

Porter, "Thriving in the world of high-speed serial interconnects," Agilent Technologies, Inc., 35 pp. (Jul. 2003).

Ren et al., "Multiple Edge Responses for Fast and Accurate System Simulations," IEEE Trans. on Advanced Packaging, vol. 31, No. 4, pp. 741-748 (Nov. 2008).

Sawyer et al., "Duty Cycle Distortion Penalty," IEEE802.3ap, 9 pp. (May 2005).

Seat, "An eye-opening look at jitter," EDN, pp. 75-76 (Oct. 17, 2002).

Sochoux et al., "Automatic Jitter Measurement Using IBIS v4.1 Models," User2User 2006, 25 pp. (May 2006).

Taborek, "IEEE 802.3 HSSG Gigagbit Ethernet," Amdahl Corp. (Mar. 12, 1996).

Widmer et al., "A DC-Balanced, Paritioned-Block, 8B/IOB Transmission Code," IBM J. Res. Develop., vol. 27, No. 5, pp. 440-451 (Sep. 1983).

Written Opinion dated Oct. 30, 2008, from International Application No. PCT /uS 08/62023.

* cited by examiner

GENERATING TRANSMISSION-CODE COMPLIANT TEST SEQUENCES

CROSS-REFERENCE TO RELATED APPLICATIONS

This application is a continuation application of U.S. patent application Ser. No. 11/880,354, entitled "Generating Transmission-Code Compliant Test Sequences," filed on Jul. 19, 2007, and naming Vladimir B. Dmitriev-Zdorov, which application in turn claimed the benefit of U.S. Provisional Patent Application No. 60/927,163, entitled "Worst-Case Pattern Generation for Linear Signal Channels," and filed on May 1, 2007. Both U.S. patent application Ser. No. 11/880,354, entitled "Generating Transmission-Code Compliant Test Sequences," filed on Jul. 19, 2007, and naming Vladimir B. Dmitriev-Zdorov and U.S. Provisional Patent Application No. 60/927,163 are hereby incorporated entirely herein by reference.

TECHNICAL FIELD

This application relates generally to the field of analyzing the signal integrity of signals using an electronic design automation software tool.

BACKGROUND

Signal integrity is an important consideration in designing today's high-speed circuits and systems. To help optimize the performance of such circuits and systems, simulation-based analysis techniques that predict the signal integrity of the various circuit paths of the system are often used before the circuit is ever manufactured. In this simulation environment, signal integrity problems (caused, for example, by noise, crosstalk, or intersymbol interference) can be identified early and the design modified if necessary.

One area where simulation-based signal integrity analysis is increasingly used is in the design of printed circuit boards ("PCBs"). When designing PCB layouts, for example, it is often desirable to analyze the signal integrity of the channels between the integrated circuits ("ICs") on the board or between various other circuit components of the PCB. In particular, the signal integrity of a channel between a driver and a buffer of a PCB layout is desirably analyzed so that the bit error rate ("BER") and eye diagram for the channel can be accurately predicted and analyzed before the PCB is manufactured. Accordingly, improved methods for analyzing the signal integrity of channels in a PCB layout or integrated circuit design are desired.

SUMMARY

Disclosed herein are exemplary methods, apparatus, and systems for generating test sequences that can be used to evaluate high-speed circuit pathways. The disclosed methods, apparatus, and systems can be used, for example, in a printed circuit board or integrated circuit design flow to analyze signal integrity or other electrical behavior. The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Among the disclosed embodiments are methods for generating a test sequence of bits that can be used, for example, to test the electrical behavior of a circuit channel. In one exemplary method, a sampled pulse response for the circuit channel is divided into a series of bit groups. The respective lengths of the bit groups in the series can comply with a transmission code (for example, the 8b10b transmission code). In this embodiment, possible code word types corresponding to the bit groups of the sampled pulse response are determined. The possible code word types can also comply with the transmission code. Further, cumulative costs are computed for one or more of the possible code word types. For example, the cumulative cost for a respective code word type can indicate how effective a sequence comprising a code word of the respective code word type together with one or more other code words is at altering the intended output of the circuit channel when the sequence is included in the test sequence. Further, in this embodiment, the test sequence is generated by selecting a sequence of code words based at least in part on the determined cumulative costs. The test sequence can be stored on one or more computer-readable media. In certain implementations, local costs for the one or more of the possible code word types are also computed. For example, the local cost for a respective code word type can indicate how effective a code word of the respective code word type is at altering an intended output of the circuit channel when the code word is included in the test sequence. In certain implementations, the cumulative cost for the respective code word type is computed in part from the local costs of the other code words in the sequence. To compute the local costs, possible code words of a respective code word type can be evaluated to determine which of the possible code words produces the lowest local cost for that respective code word type. In some implementations, cumulative costs of sequences that represent full test sequences are determined. The full test sequence producing the lowest cumulative cost can then be selected as the test sequence. In certain implementations, the code word of the respective code word type is a first code word in the sequence and a second code word is selected from among multiple possible second code words to be sequentially adjacent to the first code word. The multiple second code words can be of code word types different than the first code word. In some implementations, allowable transitions between the possible code word types are determined, and the multiple possible second code words are determined based at least in part on the allowable transitions. Further, the multiple possible second code words can have associated cumulative costs. The selection of the second code word can then be performed by selecting the second code word having the lowest associated cumulative cost. In some implementations, the bit groups into which the sampled pulse response is divided are oriented in a first orientation relative to a leading bit in the sampled pulse response, and the test sequence generation method is performed for one or more other bit group orientations relative to the leading bit. In certain implementations, the sampled pulse response is generated by simulating application of a single pulse to the circuit channel and dividing the resulting pulse response into samples. The samples can be determined, for instance, according to a bit rate at which the circuit channel is to operate. Furthermore, the sampled pulse response used with embodiments of the method can be an inverted or noninverted sampled pulse response. In certain implementations, the test sequence generated is one that minimizes an eye opening of an eye diagram displaying a representation of the circuit channel's response to the test sequence.

In other disclosed embodiments, a sequence of code words to be input on a circuit channel is determined in a nonrandom manner. In particular implementations, the sequence of code words determined complies with a transmission code (for example, the 8b10b transmission code) and is designed to cause the output voltage of the channel to be reduced during a time period in which the channel outputs a logic high value. The sequence of code words can be stored on one or more computer-readable media. The sequence of code words generated can, in some embodiments, be the worst case sequence. For example, the sequence of code words can be a sequence which minimizes the eye opening of an eye diagram that displays a representation of the circuit channel's response to the sequence of code words. In some embodiments, the act of determining the sequence includes dividing a sampled pulse response for the circuit channel into bit groups (for example, bit groups having lengths complying with the transmission code). In certain embodiments, the act of determining the sequence includes identifying possible code word types for the bit groups of the divided sampled pulse response. In some embodiments, the act of determining the sequence includes computing a value indicative of the impact a candidate code word has on reducing the output voltage of the circuit channel when the candidate code word is included in the sequence. The act of determining the sequence can also include computing a value indicative of the impact a subsequence of code words has on reducing the output voltage of the circuit channel when the subsequence of code words is included in the sequence. The act of determining the sequence can also include evaluating a code word in the sequence, and selecting a sequence of code words to precede the code word from among multiple possible sequences of code words. The selection can be based, for example, at least in part on the impact a respective one of the multiple possible sequences has on the output voltage of the circuit channel when the respective one of the multiple possible sequences is included in the sequence. In other embodiments, the act of determining the sequence includes evaluating individual code words for possible inclusion in the sequence, and selecting one or more of the code words for inclusion in the sequence based at least in part on the effect the one or more of the code words have on the output voltage of the circuit channel when the code words are included in the sequence.

In still other disclosed embodiments, alternative methods for generating a test sequence of bits for testing the electrical behavior of a circuit channel are disclosed. In one exemplary embodiment, a test sequence unconstrained by any transmission code is divided into a series of bit groups. The lengths of the bit groups in the series can comply with a transmission code (for example, the 8b10b transmission code). In this embodiment, a first bit group in the series is evaluated for compliance with the transmission code. If the first bit group is determined not to comply with the transmission code, one or more bits in the first bit group are modified so that the first bit group complies with the transmission code. The modified first bit group can be stored on one or more computer-readable media. In certain embodiments, a second bit group in the series (for example, a second group adjacent to the first bit group) is evaluated for compliance with the transmission code. If the second bit group is determined not to comply with the transmission code, one or more bits in the second bit group can be modified so that the second bit group complies with the transmission code and stored on the one or more computer-readable media. In particular embodiments, when the first bit group has a neutral disparity, the method further include determining an initial disparity for the first bit group. The determination can be based, for example, at least in part on a disparity of the second bit group. In some embodiments, the remaining bit groups in the series are sequentially evaluated for compliance with the transmission code. Respective ones of the remaining bit groups can modified if they do not comply with the transmission code and stored on the one or more computer-readable media. In some embodiments, the test sequence unconstrained by any transmission code is generated as part of the method. For example, the act of generating the test sequence unconstrained by any transmission code can include simulating application of a single pulse applied to the circuit channel in order to generate a pulse response. The pulse response can be divided into samples, thereby generating a sampled pulse response. The samples of the sampled pulse response can be determined according to a bit rate at which the circuit channel will operate and have a polarity and a magnitude. Test sequence bits having polarities opposite to the polarities of corresponding samples in the sampled pulse response can be assigned to the unconstrained test sequence. Furthermore, in particular implementations, the first bit group corresponds to a position in the test sequence adjacent to the largest value in a sampled pulse response of the channel.

Any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing test sequences or test sequence values (or any other final or intermediate results) produced by any of the disclosed methods are also disclosed.

The foregoing and other objects, features, and advantages of the invention will become more apparent from the following detailed description, which proceeds with reference to the accompanying figures.

BRIEF DESCRIPTION OF THE DRAWINGS

FIG. 6 illustrates the process of determining local costs of code word types according to an exemplary embodiment of the disclosed technology.

FIG. 7 illustrates the process of determining cumulative costs of code word types according to an exemplary embodiment of the disclosed technology.

DETAILED DESCRIPTION

Figure 1:
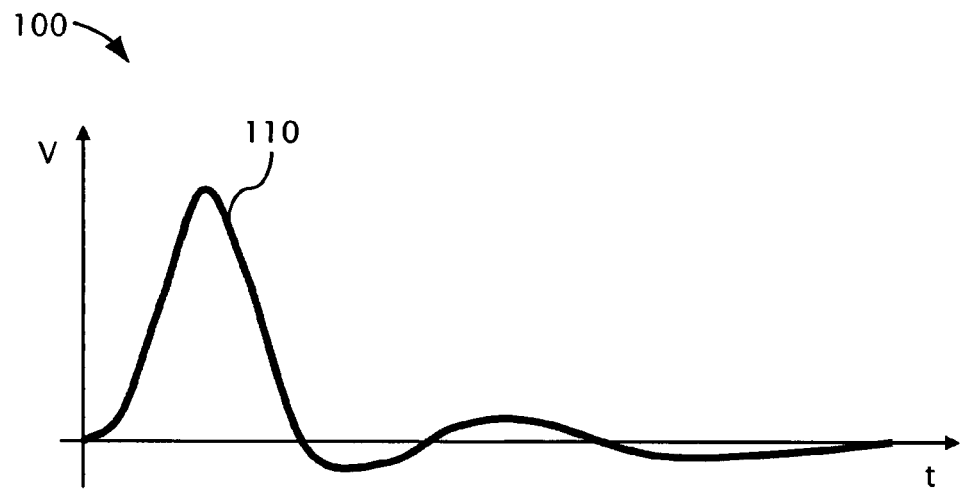
FIG. 1 is a graph showing an exemplary pulse response of a signal channel under consideration.

Disclosed herein are exemplary methods, apparatus, and systems for modeling and evaluating high-speed signals that can be used, for example, in a printed circuit board ("PCB") or integrated circuit ("IC") design flow to analyze signal integrity. The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "generate" and "determine" to describe the disclosed methods. These terms are high-level abstractions of the actual operations that are performed. The actual operations that correspond to these terms may vary depending on the particular implementation and are readily discernible by one of ordinary skill in the art.

The disclosed embodiments can be used to generate test pattern sequences for testing and evaluating the signal integrity on channels (for example, traces, vias and/or other forms of interconnect between a driver and a receiver) in a PCB layout. For example, the sequences generated can produce the worst or near worst eye openings on an eye diagram (often used to provide a visual display of the signal quality on a channel being analyzed over many transitions). The disclosed technology is not limited to PCB layout analysis, however, and can be used to evaluate interconnects, vias, and other wires in a wide variety of circuits (for example, application-specific integrated circuits ("ASICs") (including mixed-signal ASICs), systems-on-a-chip ("SoCs"), or programmable logic devices ("PLDs"), such as field programmable gate arrays ("FPGAs")). The techniques can also be used to create sequences used to evaluate power-integrity effects on a channel.

Any of the methods or techniques described herein can be performed using software that comprises computer-executable instructions for causing a computer to perform the methods or techniques stored on one or more computer-readable media. Such software can comprise, for example, an electronic-design-automation ("EDA") software tool, such as a signal integrity tool. The Hyperlynx tool available from Mentor Graphics Corporation is one example of a suitable software tool. Any such software can be executed on a single computer or on a networked computer system (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer and that the disclosed technology can be implemented using any commercially available computer. Because such computer hardware is well known in the art, the computer hardware is not described in further detail.

One or more test sequences or intermediate results produced by any of the disclosed methods, apparatus, and systems can also be stored on one or more computer-readable media as part of the described methods and techniques and are considered to be within the scope of this disclosure. Computer-readable media storing such test sequences or intermediate results may be accessed and used by a single computer or a networked computer.

Any of the disclosed methods can also be used to generate test sequences for use in a computer simulation environment wherein the test sequences are applied to representations of circuits which are stored on one or more computer-readable media. For example, the disclosed methods typically use circuit design information (for example, PCB layout information (such as a .HYP file), device models (such as IBIS models), netlists, GDSII descriptions, or HDL descriptions (such as a Verilog or VHDL descriptions), or the like) stored on computer-readable media. In certain embodiments, the circuits to be simulated are instantiated as SPICE or Eldo models for simulation. For presentation purposes, the present disclosure sometimes refers to circuit components by their physical counterparts (for example, drivers, channels, signals, and other such terms). It should be understood, however, that any such reference not only includes the physical components but also representations of such circuit components and signals on the components as are used in computer-implemented signal integrity analysis environments.

Generating Test Sequences

Described below are two representative embodiments for generating test sequences for testing electrical behavior (e.g., the signal integrity) of channels between drivers and receivers in a PCB layout. The resulting test sequences can be used, for example, in a simulation tool used to analyze the signal integrity of channels in a PCB layout. As noted, the described methods can be used to generate sequences for other circuit environments as well. In general, the test sequences desirably represent the "worst-case" scenario for bit sequences on the channel. It is to be understood that the term "worst case" does not necessarily refer to the absolute worst case, but encompasses test sequences that cause the output level (voltage) of the channel to be altered from its ideal output level by other amounts (for example, within 5% of its worst possible performance, 10% of its worst possible performance, or other desired figure).

Furthermore, certain implementations of the described embodiments generate test sequences in a nonrandom fashion. For example, some of the implementations of the disclosed embodiments generate test sequence by evaluating possible code words to include in a test sequence according to certain criterion or figures of merit that indicate the desirability of including respective code words in the test sequence.

Furthermore, the described embodiments can be used to generate sequences for circuits designed to operate according to a certain transmission code (also referred to as a line code). For illustrative purposes, the embodiments are described in the context of the 8b10b transmission code, though it is to be understood that the methods can be readily adapted for use with other transmission codes. 8b10b transmission codes are discussed in more detail in Widmer A. X., Franaszek P. A., "A DC-Balanced, partitioned-block, 8b/10b transmission code," *IBM J. Res. Development*, Vol. 27, No 5, September 1983, pp. 440-451.

First Illustrative Embodiment

In certain implementations of the first illustrative embodiment, the method for generating a test sequence uses the inverted sampled pulse response (Q(k), k=1 ... N) of the channel under consideration. The inverted sampled pulse sequence can be obtained, for example, by performing a circuit simulation of the channel (for example, using analytical models of the channel, SPICE models, IBIS models, transistor-level models, ideal voltage source models, or other such models). In other implementations, the pulse response is measured from a test chip or other physical chip implementing the channel under consideration. It should be understood that the noninverted sampled pulse response can be used with any of the test sequence generation methods described herein. In such cases, the direction in which the test sequence is generated relative to pulse response will ordinarily be reversed.

Figure 2:
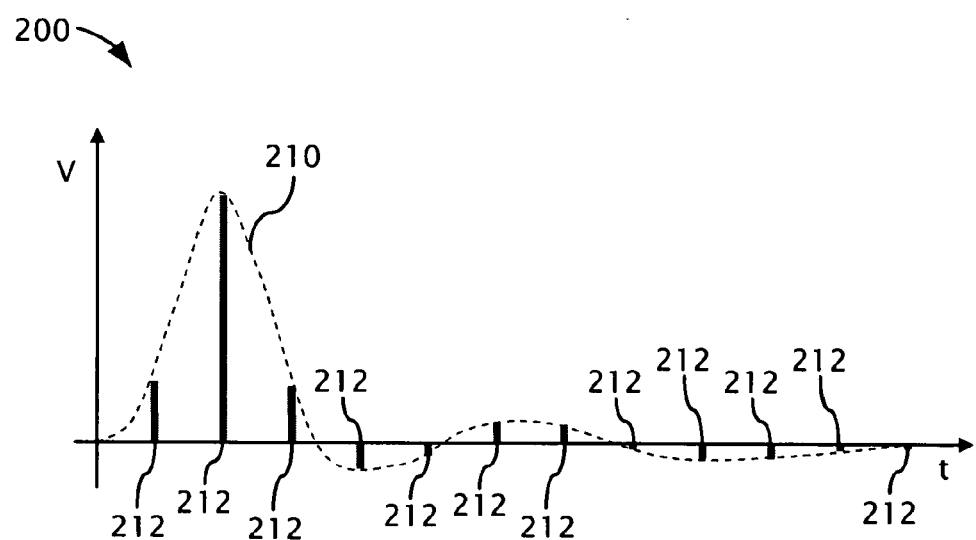
FIG. 2 is a graph showing an exemplary sampled pulse response generated from the pulse response of FIG. 1.

According to one exemplary implementation, the pulse response is assumed to be a factor 0.5 of the difference between the channel's response to a single bit pulse (for example, representing the sequence " ... 01000000000 0000 ... ") and the constant level corresponding to the prolonged logical state "0". In other implementations, the pulse response can be scaled using different factors or values. Because the start and end level of the pulse response is the same, the difference can be defined such that it starts and ends at a zero level, as illustrated by pulse response 110 shown in graph 100 of FIG. 1. In certain implementations, the samples of the pulse response are taken according to the bit rate, one sample per bit. FIG. 2 shows a graph 200 wherein samples 212 within a pulse response 210 are illustrated at intervals along the time axis corresponding to the bit rate of the channel under consideration.

In certain implementations, the input to the channel under consideration is assumed to be a two-level (binary) signal, also sampled with the bit rate. In the illustrated implementation, for example, the channel's input is assumed to have the following possible values: x(i)=+1 (corresponding to logical "1") or −1 (corresponding to logical "0"). In this implementation, vertical scaling does not affect the solution.

The sampled output of the channel y(k) can be computed as a convolution between the channel's input x(k) and the response P(k), both sampled accordingly. For example, in certain desirable implementations, the following expression is used to determine the sampled output of the channel:

$$y(k) = \sum_{i=1}^{k} P(k-i)x(i) \tag{1}$$

Figure 3:
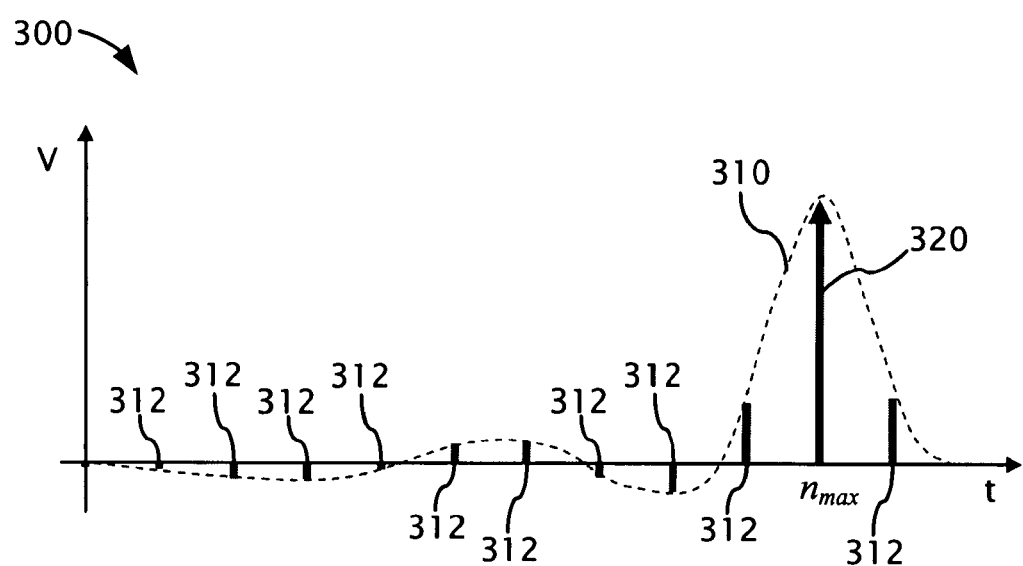
FIG. 3 is a graph showing an exemplary inverted sampled pulse response generated from the sampled pulse response of FIG. 2.

To simplify considerations, the sampled response P(k) can be inverted in time, thus producing an inverted sampled pulse response (Q(k)), such as inverted sampled pulse response 310 with samples 312 shown in graph 300 of FIG. 3. According to one exemplary implementation, the position of the largest positive peak in the response is denoted as $n_{max}$: $Q(n_{max}) > |Q(n)|$, $n \neq n_{max}$. In FIG. 3, the corresponding maximum sample value is shown with arrow 320.

Determining Unconstrained Test Sequences Representing the "Worst Case"

The system output can now be represented as:

$$y(k) = \sum_{i=1}^{k} Q(i)x(i). \tag{2}$$

From Expression (2), an unconstrained combination of input pulses x(k) that reduces the output at its last sample value y(N) can be found. For example, Expression (2) can be used to determine a test sequence that represents the "worst case" sequence. According to one exemplary implementation, one can assume that a logical "1" (the value intended to be output from the channel) corresponds to the level "high." The value at the pulse maximum (arrow 320) can then be assigned to the value "+1". That is, the input value $x(n_{max})$ can be assigned to "+1" to represent the logical "1". In one implementation, to find the unconstrained worst case sequence, the values of the rest of the input bits (x(n)) can be chosen arbitrarily so as to minimize (or otherwise reduce to a desirable level) the total output. For example, the following expression can be used:

$$\min(y(N)) = \min \sum_{n=1}^{N} Q(n)x(n). \tag{3}$$

Because x(n) is either +1 or −1, the minimum can be reached if, whenever possible, Q(n) and x(n) have opposite signs. Hence, in one exemplary implementation:

$$x(n \neq n_{max}) = \begin{cases} -1, & Q(n) \geq 0 \\ +1, & Q(n) < 0 \end{cases}. \tag{4}$$

From Expression (4):

$$y_{min}(N) = Q(n_{max}) - \sum_{n \neq n_{max}} |Q(n)|. \tag{5}$$

The above procedure can be applied to the samples of Q(n) directly. An example is shown in Table 1 below. In Table 1, the first column indicates the sample index (n), the second column indicates the value of Q(n) at the corresponding sample number, and the third column represents the value of the input bit in the corresponding position of the input sequence that would produce the unconstrained worst case sequence according to Expression (3). The leading bit (corresponding to the bit at $n_{max}$) is shown in bold in the double-lined cell.

TABLE 1

Inverse Sampled Response and the Worst Case Sequence

| N | Q(n) | x(n), unconstrained | x(n), 8b10b | group desig. |
|---|------|---------------------|-------------|--------------|
|   |      |                     | +           | 4            |
|   |      |                     | +           |              |
|   |      |                     | +           |              |
| 1 | 0.001 | - | - | |
| 2 | 0.002 | - | + | 3 |
| 3 | 0.003 | - | - | |
| 4 | 0.005 | - | - | |
| 5 | 0.004 | - | - | |
| 6 | 0.003 | - | - | |
| 7 | 0.001 | - | + | |
| 8 | -0.001 | + | - | 2 |
| 9 | -0.003 | + | + | |
| 10 | -0.008 | + | + | |
| 11 | -0.010 | + | + | |
| 12 | -0.007 | + | + | 1 |
| 13 | 0.011 | - | - | |
| 14 | 0.023 | - | - | |
| 15 | -0.032 | + | + | |
| 16 | -0.081 | + | + | |
| 17 | 0.151 | - | - | |
| 18 | 0.768 | + | + | 5 |
| 19 | 0.072 | - | - | |
| 20 | 0.010 | - | - | |
|    |       |   |   | |

8b10b Sequence Constraints

As noted above, in certain implementations, it is desirable to generate the worst case sequence that complies with a given transmission code (for example, the 8b10b, 4B5B, 6B8B, 64B66B, or other suitable transmission code). For illustrative purposes only, the disclosed technology is described as being applied to the 8b10b transmission code. It should be understood that the disclosed technology is readily adaptable to a wide variety of other transmission codes.

For the 8b10b protocol, and according to one exemplary embodiment of the disclosed technology, the following constraints are applied: (1) a bit group's individual disparity can only be −2, 0, or +2; (2) for a sequence of bit groups, the running disparity must alternate; and (3) the running length of any series of bits cannot exceed 5. These constraints are discussed in greater detail in the following paragraphs. It should be understood that when the disclosed techniques are applied to other transmission codes, other criteria may be adapted for those codes. Furthermore, while the embodiment described herein applies all three of the constraints, other embodiments use only or one or two (in any combination) of the constraints.

According to the 8b10b transmission code, the bit stream is divided into alternating bit groups of 6 and 4 bits. For each group, a disparity can be defined. In one implementation, the disparity is a number showing the balance between logical "1s" and "0s" in a bit group. If the bit group has an equal number of "1" and "0"s, its disparity is zero. Since the number of bits in a bit group is even, the smallest nonzero disparity will be either "−2" or "+2." For example, the bit group "0101" has "0" disparity, "1101" has "+2" disparity, and "0100" has "−2" disparity. Furthermore, in this exemplary embodiment, a bit group is not permitted to have a larger disparity than "+2" or "−2."

A running disparity builds by accumulating the individual disparities (sometimes referred to as the "partial disparities") of the bit groups considered so far. Furthermore, and according to a particular implementation, an initial running disparity can be set to either a "+1" or "−1." According to the running disparity constraints introduced above, a bit group having a negative running disparity is to be followed by a bit group having a neutral ("0") or positive ("+2") disparity. Similarly, a bit group having a positive running disparity is to be followed by a group having a neutral ("0") or negative ("−2") disparity. The subsequent group's disparity can be added to the existing running disparity, resulting in an updated running disparity. The updated running disparity can then be associated with the subsequent group. Thus, if the initial running disparity is "−1" and the subsequent group is "+2," the running disparity value changes from "−1" to "+1" and the subsequent group is said to have a running disparity of "+1." In certain implementations, a group with a neutral disparity does not change the value of the running disparity.

Running length indicates the number of "1"s or "0"s standing in a row. Because of the disparity considerations mentioned above, no group may have five "1"s or five "0"s. However, when the groups are concatenated, there may occasionally be five or even six identical bits in a row. For the embodiment following the constraints introduced above, a running length of six is avoided because such a running length is not allowed.

In certain implementations, the disparity and running length rules are invariant to a time inversion. For example, for sequences complying with the 8b10b protocol, when the sequence is presented in an inverse order, the inverted sequence will also be 8b10b compliant. Based on this observation, it follows that one can generate the sequences by propagating the disparity and running length rules in either direction, into the "future" or into the "past" or even by starting the building of the sequence at some point "in the middle."

Building Worst Case 8b10b Sequences

In one exemplary implementation, it is desirable to make the smallest number of modifications to the unconstrained worst case sequence in order to create a 8b10b compliant sequence. It will ordinarily be necessary, however, to make some adjustments to achieve the desired group disparity and running length.

Figure 11:
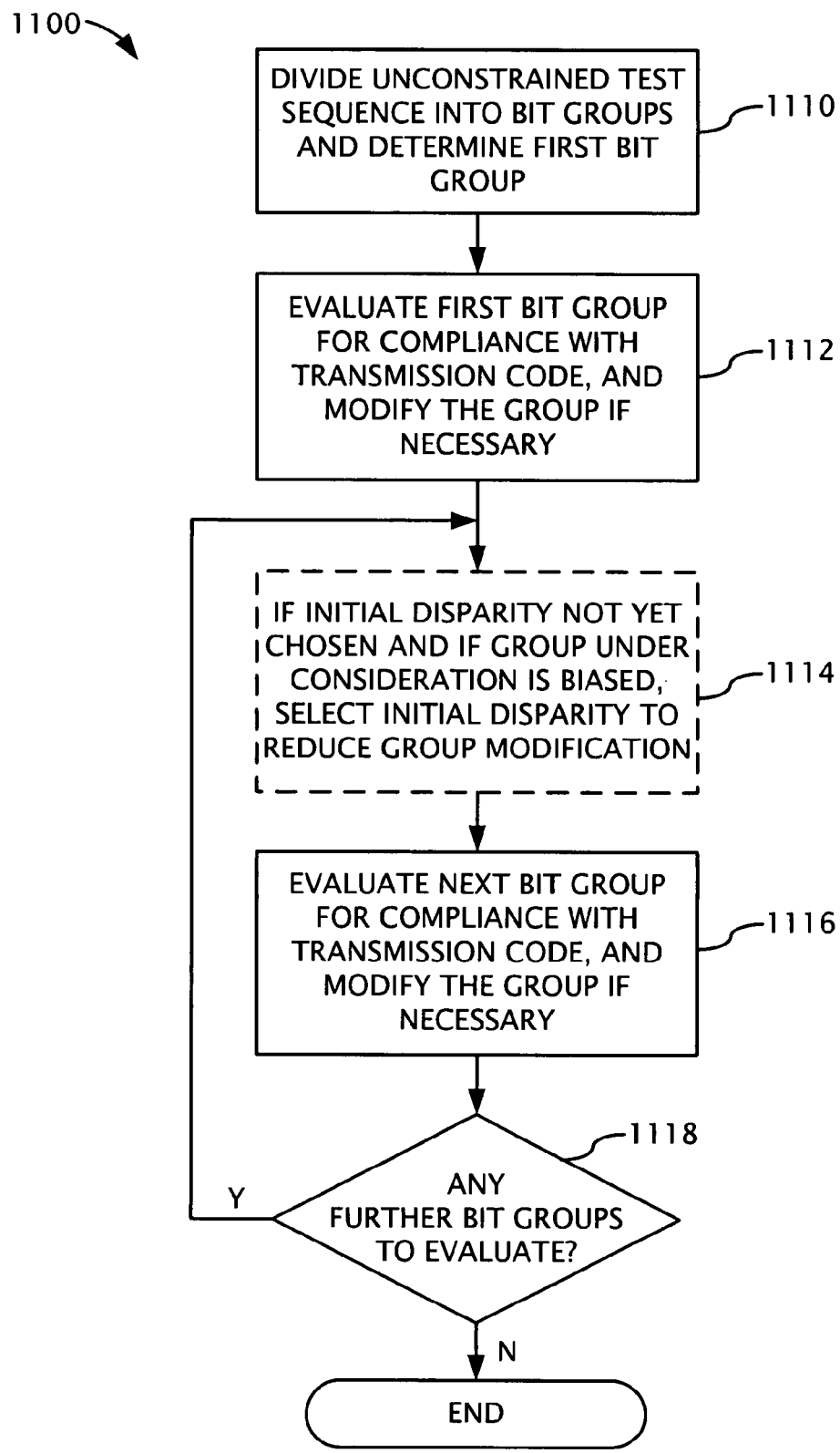
FIG. 11 is a flowchart of a first exemplary embodiment for generating test sequences.

FIG. 11 is a flowchart 1100 showing a method of generating test sequences according to one exemplary embodiment. The method acts shown in FIG. 11 can, in certain circumstances, be performed in a different order, or performed alone or in various combinations and subcombinations with one another.

At 1110, the unconstrained test sequence (for example, the unconstrained worst case sequence generated using Expression (3) above) is divided into bit groups and the location of the first group to generate in the test sequence is determined. Defining the first group (and, as discussed below, choosing the initial disparity) is a choice that can produce an overall reduction in the number of changes to the unconstrained group. For example, the initial running disparity of the first group is desirably selected so as to minimize (or otherwise reduce) the overall number of changes to the unconstrained test sequence. After the first group is chosen at 1110, the running disparity constraint will be considered, meaning that there is less choice in selecting the subsequent groups.

In one desirable embodiment, the group that corresponds to values having the greatest magnitude (by bit group) in the pulse response and excluding the leading bit is selected as the initial bit group. Typically, the group with values having the greatest magnitudes is the first post-leading-bit group (that is, the group of samples that directly follow the main (leading) bit). For the exemplary inverted response introduced above in FIG. 3, for instance, the group with values having the greatest magnitude is formed from the samples preceding the main bit. Specifically, the first group is selected to comprise the bits at positions n=17 . . . 12 and is designated as group 1 in the fourth column of Table 1. Note that in this example, a first group of 6 bits was selected, although a group of 4 bits would also have been a valid choice and could alternatively have been selected. In certain implementations, the sequence generating technique 1100 is performed multiple times (for example, using all possible initial selections or any subset thereof), and the worst of the generated solutions selected.

At 1112, the first group is evaluated for compliance with the transmission code and modified if necessary. In one embodiment, the fewest changes possible are made to the group in order for it to comply with the transmission code. Techniques for modifying the group are discussed in more detail below with respect to method act 1114. In this example, the first group is already compliant with the 8b10b transmission code and no further modifications are necessary.

In this example, the first group (comprising "+---++-" in the unconstrained solution) is initially considered neutral. In certain embodiments, its disparity can be left as neutral. Or, in some embodiments, when the first group is neutral, it is possible to designate the group as either having a positive or negative initial disparity. This selection can be made, for example, once the first biased group is encountered during application of the technique 1100 as shown by method act 1114 and can be selected so as to minimize or reduce the modifications made to the biased group or later-considered groups. In the illustrated embodiment, method act 1114 is typically only performed once (when the first biased group is encountered and as signified by the dashed lines in FIG. 11) and may be performed concurrently with method act 1116.

At 1116, the next bit group of the unconstrained test sequence is evaluated for compliance with the transmission code and modified if necessary. For example, the illustrated embodiment proceeds toward the front of the sequence, though other embodiments proceed in the opposite direction. In this example, the next group is group 2 shown in Table 1 having indexes 8-11. The 4 bits of the unconstrained group have the following polarities: "++++." This is not a valid group in the protocol. Since the pre-existing disparity has not yet been defined, one can select the initial disparity at 1114 as being negative (for example, in order to allow for more "1"s in group 2). This running disparity value ("−1") is desirably stored, as it will be used when the top of the table is reached and the technique continues from the group beginning at n=18. In order to comply with the constraints introduced above, one of the "+" bits in the group with indexes 8-11 is desirably replaced by a "−." In one exemplary implementation, the "+" bit to change is selected so as to further reduce (for example, minimize) the impact to the resulting eye opening in an eye diagram. For example, Expression (3) can be used to determine which bit should have its polarity reversed. In certain embodiments, the smallest impact is produced if the sign corresponding to the smallest pulse response sample value in the group is selected. Here, for example, this value is 0.001 at n=8. Group 2 is now defined, and the running disparity is changed to positive ("+1").

At 1118, a determination is made as to whether any further bit groups remain to be evaluated. If so, the technique 1100 returns to 1114, where the next bit group is evaluated. Otherwise, the technique 1100 terminates. In the illustrated embodiment, group 3 (indexes 2-7) is evaluated next. Group 3 is a group of 6 bits all being logical "0"s or "−"s. This is not a valid 8b10b group according to the constraints introduced above. Since the running disparity is positive, a group with negative disparity ("−2") can be selected. In this example, two bits of group 3 are desirably converted into positive bits in order to comply with the disparity constraints. As before, the smallest samples within the group are selected. In the illustrated example, these are numbers n=2 and 7. Group 3 is now defined, and the running disparity is changed to negative ("−1").

In the illustrated example, the technique 1100 has now reached the top of the unconstrained sequence in Table 1 and the top group is initially incomplete. In one desirable implementation, the samples are extended at the top (or bottom) of the table with zero values. Such extensions will not ordinarily affect the result estimated by Expression (3). The group with missing bits can therefore be built up as needed, by considering the existing and desired disparity. In the illustrated example, for instance, group 4 is filled with "+" bits in order to maintain the constraint that the groups have alternating disparity. Group 4 is now defined, and the running disparity is changed to positive ("+1"). Group 4 could alternatively have been filled with two positive bits and a negative bit, resulting in a neutral group.

In one implementation, the technique 1100 considers the bits at the end of the sequence (the bottom of the table) once the top is reached, though these bits could have been considered at any time after the initial group is determined. In the illustrated example, the bits having indexes 18-20 form an incomplete group. This group can be extended by adding one or more zero samples. In this example, the pre-existing disparity selected for group 1 was negative. Hence, group 5 can either be neutral or negative. Both are possible and no modification is required. In the illustrated example, a group with negative disparity is selected and the running disparity is modified accordingly. Now, with the running disparity updated, the technique could continue moving down the table if required.

The constraints applied in the exemplary technique 1100 described above can be summarized in a more formal fashion as shown in Table 2.

TABLE 2

| | Logical 'ones' to be replaced with 'zeros' | | | | | | |
|---|---|---|---|---|---|---|---|
| Pre-existing | Group disparity | | | | | | |
| running disparity | −6 | −4 | −2 | 0 | +2 | +4 | +6 |
| −1 | −3 | −2 | −1 | 0 | 0 | 1 | 2 |
| 0 (not yet initialized) | −2 | −1 | 0 | 0 | 0 | 1 | 2 |
| +1 | −2 | −1 | 0 | 0 | 1 | 2 | 3 |

For each possible value of the group disparity and pre-existing running disparity, Table 2 shows the number of bits in which "1"s should be changed into "0"s (or the reverse, if the number is negative). For example, let the running disparity be "−1" and the next (or subsequent) group be "001001". This next group's self disparity is −2 (−4+2=−2). From the first row and third column, a change of "−1" is desirable to comply with the 8b10b constraints. Thus, one 0-to-1 transformation can be used to make the bit group neutral. If the pre-existing running disparity for the same group is positive ("+1"), then Table 2 indicates that the group can remain unchanged, resulting in a running disparity equal to "−1" (+1−2=−1).

In the example described above, no modifications were required on account of an excessive running length. However, running "1"s violations can occur, for example when concatenating the following group pairs from the 8b10b protocol:

[001111][1100]→P6/Z4 (6-bit group with positive disparity, 4-bit with zero disparity)
[000111][1110]→Z6/P4
[0011][111000]→P4/Z6
[0011][111100]→Z4/P6

Note that all of the above groups are either of the PZ or ZP type. Therefore, the pre-existing disparity could only be negative. With a negative pre-existing disparity, the subsequent groups could be one of the following: ZZ, PZ, ZP, PN (here N stands for negative group disparity). To reduce the impact from changing logical bit values, the number of group types changed can be minimized in certain desirable implementations of the disclosed technology. For example, if a running "1" violation is detected, the combinations PZ can be changed into ZZ or PN, depending on whichever group contains the smallest sample value that corresponds to the bit in the group of logical "1"s. Further, the combination ZP can be changed into ZZ.

Similar considerations can be made for running "0" violations. For example, in certain implementations, the solutions for running "0" violations are found by swapping "0"/"1" and "P"/"N" in the above discussion.

In general, the exemplary technique described above modifies the unconstrained worst case sequence to comply with the 8b10b protocol. For example, in the embodiment illustrated by Table 1, each 6- or 4-bit group was modified so as to minimize the difference between the constrained and the original unconstrained sequence. Minimization was made locally for each group without considering possible consequences for the groups to follow. Although the technique produces high quality worst-case sequences, the technique may not produce the worst case sequence. The second illustrative embodiment is an alternative method and does not modify the unconstrained worst case sequence. Implementations of the second illustrative embodiment produce even higher quality worst case sequences. For example, higher quality results can be obtained by considering the impact of a bit group globally in the sequence rather than locally. Certain implementations of the second illustrative embodiment are understood to produce the theoretical "worst case" sequence.

Second Illustrative Embodiment

Given a linear time-invariant signal channel characterized by its pulse response, and the duration of the bit interval, another embodiment of the disclosed technology can be used to generate a binary pattern of a given length that complies with the 8b10b transmission protocol and creates the worst case sequence for testing signal integrity and bit error rates. For example, the sequences generated can produce the worst or near worst eye openings on an eye diagram (often used to provide a visual display of the signal quality on a channel being analyzed over many transitions).

In certain exemplary implementations, the test sequence generation technique uses the inverted sampled pulse response $Q(k), k=1 \ldots N$ as input. The inverted sampled pulse response is discussed in more detail above. As with the implementations described above, it should be understood that the noninverted sampled pulse response can be used with any of the test sequence generation methods described herein. In such cases, the direction in which the test sequence is generated relative to pulse response will ordinarily be reversed.

Briefly, and according to one exemplary embodiment, the test sequence to be generated is first represented by a chart (or other appropriate data structure, model, table, or representation) indicating possible code word types (and accounting for possible word length and pre- and post-word disparity constraints) and the allowed transitions between them. Then, for one or more code word types, a candidate code word is selected (for example, the "worst" candidate) from the code word table by estimating its individual "cost." Individual costs can be estimated by element-by-element multiplication of the word bit values (for example, "+1" or "−1") with the corresponding portion of the sampled pulse response. If the current portion of the response contains the leading sample, the set of considered code words can be limited to those that contain "1" in the corresponding position.

A forward and backward sweep can be performed along the word sequence. In certain exemplary implementations, the forward sweep finds the "worst" choice (or other desirably bad choice) between the possible word types in each word position. In certain desirable implementations, this choice is based on estimating the cumulative cost (for example, the sum of the individual cost and the cumulative cost from a respective word's "worst" predecessor). From the forward sweep, the final "worst" word in a sequence can be determined and its type defined.

The backward sweep is performed to identify the chain of predecessors that led to the final "worst" word. Among several cost values, for example, the "worst" choice can be determined by selecting the smallest value. As a result, the generated sequence produces a desirably small (and in some implementations, the smallest) product of the bit values and sampled pulse response, and thus produces a small (for example, the minimum) eye-height measure. Additional details of these individual method acts are described in the sections below.

8b10b Protocol Code Word Types and Tables

To represent the possible 8b10b coding words (also referred to as code words, bit groups, or groups) and their allowed transitions, each possible 8b10b coding word (or other desirable number of coding words) can be categorized into a fixed number of types. For example, in one exemplary implementation, a type is defined by a self disparity, and a resulting (post) disparity. For purposes of this discussion, a pre-existing disparity is denoted with a small prefix "n" (negative) or "p" (positive). The self-disparity, which may be P (positive), N (negative), or Z (zero) complemented by the group length, is set forth in the middle of the code word type. The postfix ("n" or "p") shows the resulting running disparity. For example, the type "nP6p" is a 6-bit group with a negative pre-existing disparity, a positive self disparity, and a positive post-running disparity.

In general, for the 8b10b protocol, there are only eight group types available: nP6p, pN6n, nZ6n, pZ6p and nP4p, nZ4n, pN4n, pZ4p. Although the exemplary techniques described herein are not sensitive to the particular code words allowed for each group type, code words for each group type according to the 8b10b transmission code are shown in Table 3 for illustrative purposes.

TABLE 3

8b10b Code Words Used in Different Word Types

| NN | nP6p | pN6n | nZ6n | pZ6p | nP4p | pN4n | nZ4n | pZ4p |
|---|---|---|---|---|---|---|---|---|
| 1 | 011011 | 100100 | 110001 | 110001 | 1011 | 0100 | 1001 | 1001 |
| 2 | 111010 | 000101 | 101001 | 101001 | 1101 | 0010 | 0101 | 0101 |
| 3 | 110110 | 001001 | 011001 | 011001 | 1110 | 0001 | 1010 | 1010 |
| 4 | 001111 | 110000 | 100101 | 100101 | 0111 | 1000 | 0110 | 0110 |
| 5 | 101110 | 010001 | 010101 | 010101 | | | 1100 | 0011 |
| 6 | 011110 | 100001 | 110100 | 110100 | | | | |

TABLE 3-continued

8b10b Code Words Used in Different Word Types

| NN | nP6p | pN6n | nZ6n | pZ6p | nP4p | pN4n | nZ4n | pZ4p |
|----|------|------|------|------|------|------|------|------|
| 7  | 101011 | 010100 | 001101 | 001101 | | | | |
| 8  | 100111 | 011000 | 101100 | 101100 | | | | |
| 9  | 011101 | 100010 | 011100 | 011100 | | | | |
| 10 | 101101 | 010010 | 100011 | 100011 | | | | |
| 11 | 110101 | 001010 | 010011 | 010011 | | | | |
| 12 | 111001 | 000110 | 110010 | 110010 | | | | |
| 13 | 010111 | 101000 | 001011 | 001011 | | | | |
| 14 | 110011 | 001100 | 101010 | 101010 | | | | |
| 15 | | | 011010 | 011010 | | | | |
| 16 | | | 100110 | 100110 | | | | |
| 17 | | | 010110 | 010110 | | | | |
| 18 | | | 001110 | 001110 | | | | |
| 19 | | | 111000 | 000111 | | | | |

Note that group types with neutral disparity and the same size may have common words. Most of the nZ6n and pZ6p words are similar, except for the last row. The same is true for nZ4n and pZ4p types. The reason the distinction was introduced between these neutral groups was to prevent running length violations. For example, after the "positive" word "001111," the neutral word "0011" (type pZ4p) may follow, but not the neutral word "1100" (type nZ4n) which would create six "1"s in a row.

Code Word Type Transition Chart

Figure 4:
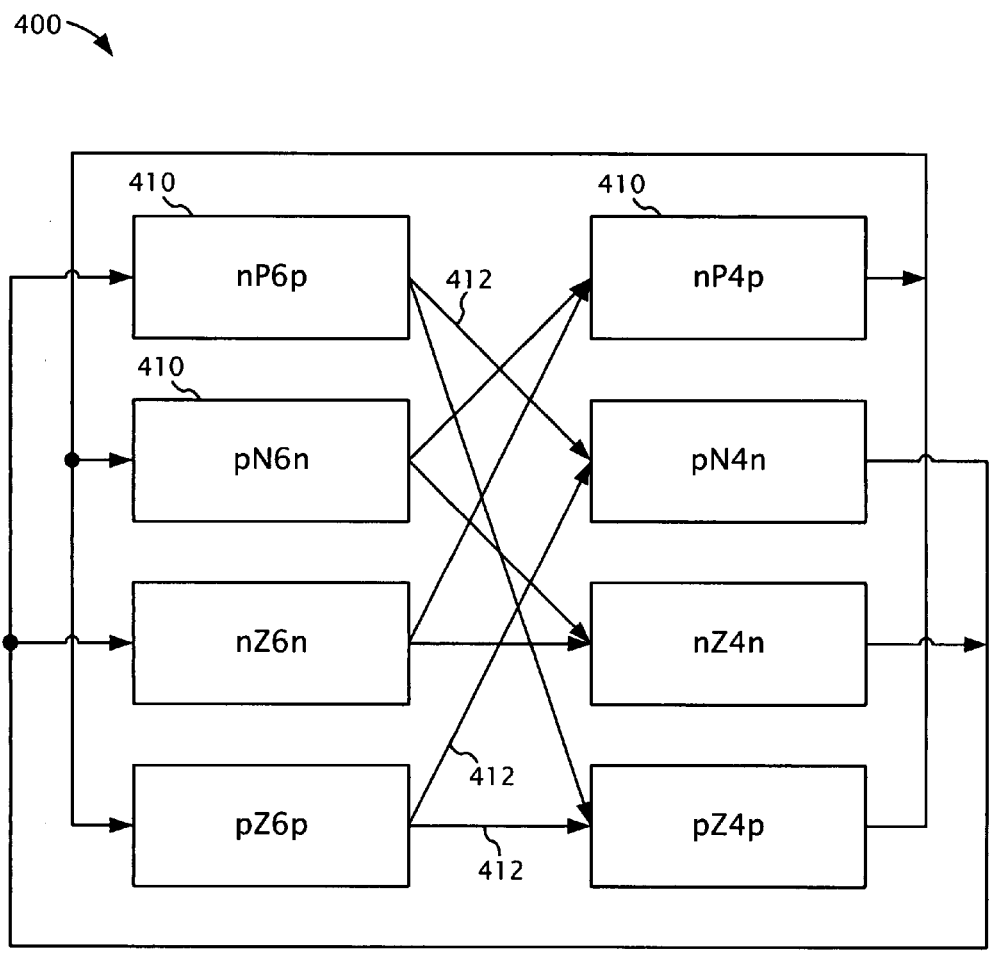
FIG. 4 is a schematic block diagram showing code word types and allowed transitions between the code word types according to an exemplary transmission code.
Figure 5:
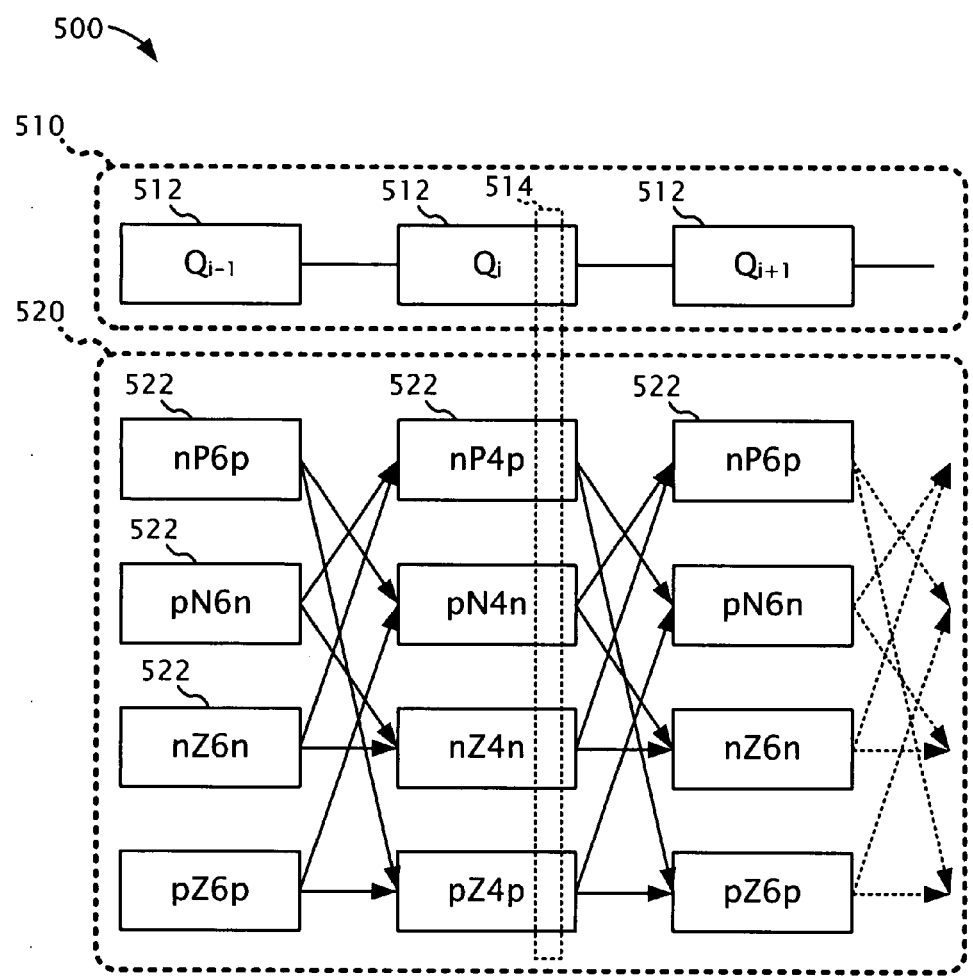
FIG. 5 is an exemplary representation showing an arrangement of possible code word types relative to bit groups in a sampled pulse response as may be used to generate a test sequence using embodiments of the disclosed technology.
Figure 6:
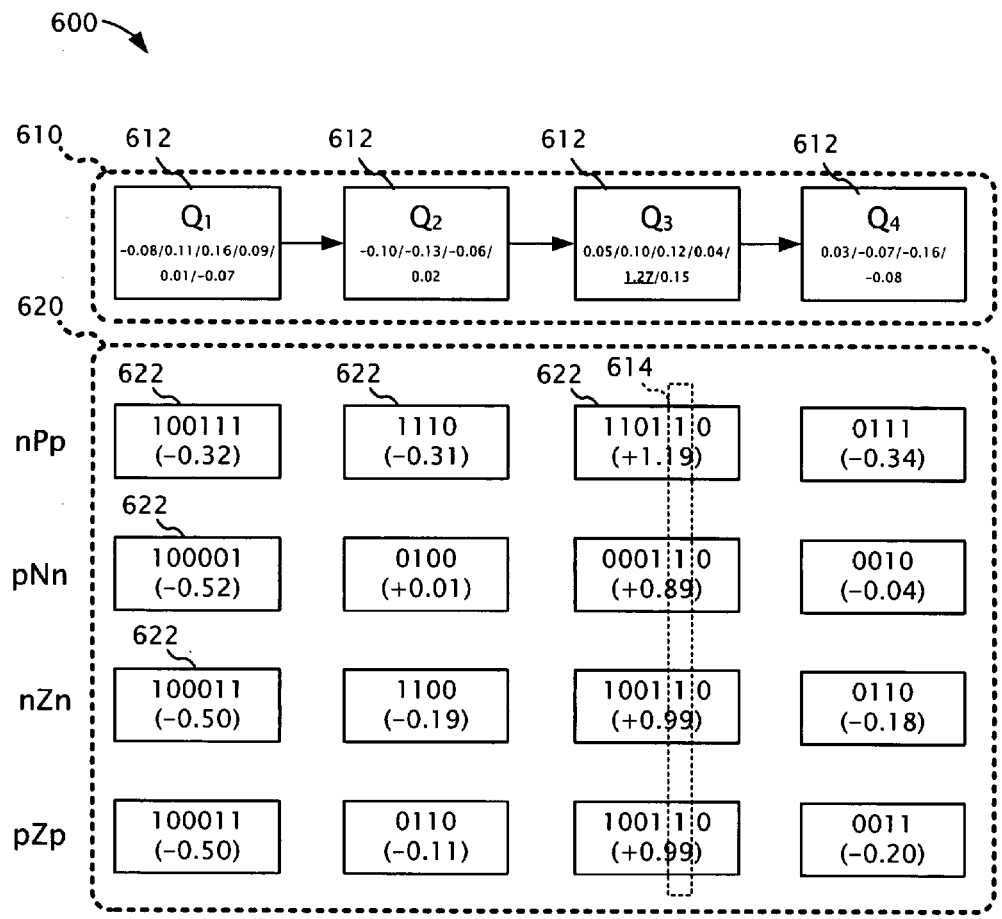
FIG. 6 illustrates the use of a representation according to FIG. 5 as part of an exemplary test sequence generation procedure. In particular.
Figure 7:
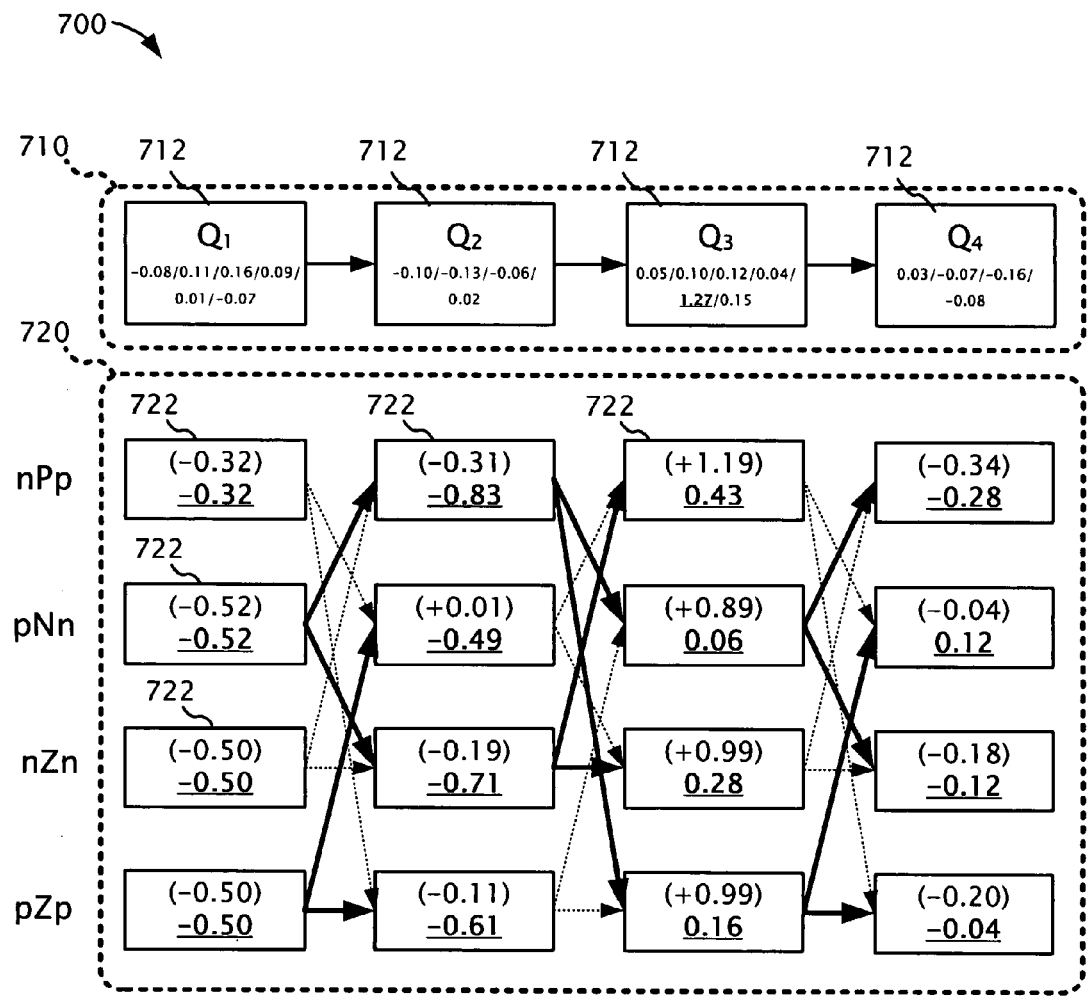
FIG. 7 also illustrates the use of a representation according to FIG. 5 as part of an exemplary test sequence generation procedure. In particular.

Using definitions such as those introduced above, rules can be formulated that indicate how the code word types may precede and follow each other according to any given transmission code (for example, the 8b10b transmission code). For example, the available transitions between the code word types introduced above and for one exemplary implementation are shown in FIG. 4. In particular, FIG. 4 is a schematic block diagram 400 showing the various possible code word types 410 along with the possible transitions between the code word types (shown by arrows 412). For ease of illustration, only a few representative samples of the code word types 410 and arrows 412 are designated in FIG. 4. FIGS. 5, 6, and 7 similarly call out only a few representative code word type representations.

The rules followed by the exemplary implementation illustrated in FIG. 4 are derived from the constraints introduced above and comprise the following: (1) the resulting disparity of a word (indicated by its postfix according to the format introduced in the previous section) must be equal to the pre-existing disparity of the next code word type (indicated by the code word's prefix), and the code word lengths (6 or 4 bits) must alternate. Note that in this exemplary implementation, each code word type has two possible predecessors and two possible successor code word types.

As in the first representative embodiment, one goal to be achieved in exemplary implementations of the second representative embodiment is to reduce (or minimize) the relation:

$$\min(y(N)) = \min \sum_{n=1}^{N} Q(n)x(n) \quad (6)$$

by appropriately choosing the code words constituting the binary sequence x(n). In Expression (6), Q(n) is the inverted sampled pulse response (as described above) for a channel under consideration. In general, the bit elements in x(n) can be chosen, but not in Q(n). In addition, a certain predefined bit of an index $n_{max}$, can be assumed to be a logical "1". Thus, $x(n_{max})$ can be fixed to the logical "1".

To illustrate the exemplary procedure, assume that a 6-bit group is chosen as the starting group for the sequence so that the sequence of groups constituting x(k) along with the response Q(k) can be arranged as in schematic block diagram 500 shown in FIG. 5. In particular, the diagram 500 of FIG. 5 includes a region 510 in which representations showing the values of the sampled pulse response in the corresponding group position $Q_i$ are displayed. These representations are referred to herein as pulse response groups 512.

In FIG. 5, the group $Q_i$ (a 4-bit group) is shown as having the leading bit position. In particular, frame 514 is a representation showing the location of the leading bit within the code word type representations 522 corresponding to group $Q_i$. The leading bit (for example, the bit in the inverted sampled pulse response with the greatest value) can be oriented at other bit positions within the test sequence. For the 8b10b transmission code, for example, there are 10 different choices for how to orient the leading bit, as a pair of adjacent groups consists of 10 bits. In certain implementations, the procedure described below can be repeated for each such starting position (or for other numbers of the positions) in order to find the "worst" possible sequence. Furthermore, to make the terminal groups complete, and in certain exemplary implementations, a certain number of zero samples can be added at the beginning and/or at the end of a response Q(k).

At this point, the groups in Q(k) and x(k) can be assumed to be aligned and the position of the leading bit (and the group containing it) defined. From the resulting sequence of groups, a starting group ($Q_1$) can be identified (corresponding to the group $Q_1$ having the first values of the inverted sampled pulse response).

FIG. 5 also shows a code word region 520 that includes representations of the possible code word types that may be selected to create the worst-case sequence. A sample of these representations is shown as code word type representations 522. Conceptually, the representation 522 in FIG. 5 can be viewed as placeholders for four different types of codes words for each position i. In this example, each code word type representation 522 allows for storing its available predecessors, its optimal predecessor, its local cost value, a cumulative cost value, and its local (6- or 4-bit long) code word (or bit pattern).

Figure 12:
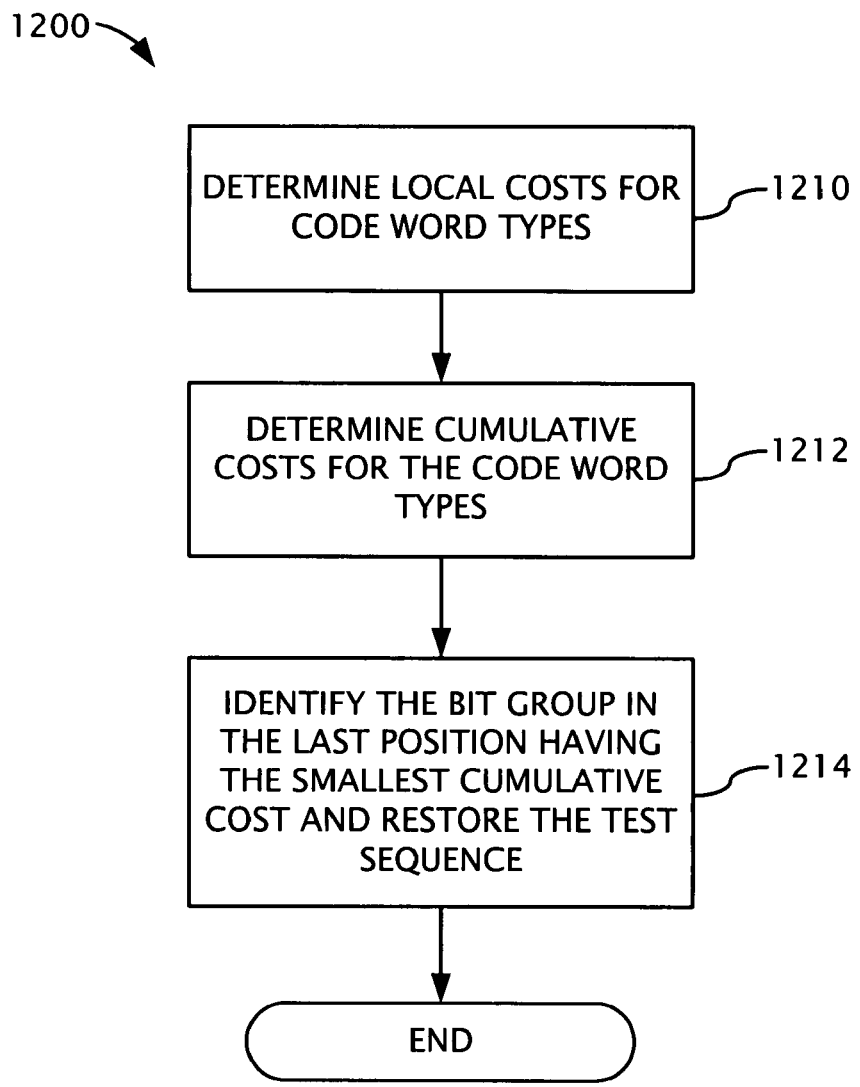
FIG. 12 is a flowchart of a second exemplary embodiment for generating test sequences.

FIG. 12 is a flowchart 1200 showing one exemplary implementation for generating the worst-case sequence according to the disclosed technology. The method shown in FIG. 12 is performed using a chart, data structure, model, table, or representation arranged according to the format introduced above with respect to FIG. 5. Thus, the procedure 1200 assumes that a starting position has already been determined. As noted below, however, the procedure can be performed for each possible starting position, thereby creating different starting positions, and the overall worst sequence selected from the various results obtained. The method acts shown in FIG. 12 can, in certain circumstances, be performed in a different order, or performed alone or in various combinations and subcombinations with one another.

At 1210, local costs for each of the possible code word type representations can be determined. In particular, in one implementation, local optimums can be found for each index position i for each code word type at a respective index position (in alternative embodiments, only a subset of the index positions or code word types are considered). This act is performed because it is typically not yet known which code word type will be selected in every position. In one exemplary implementation, this method act can be performed by minimizing the relation $$\text{cost}(j, \text{type}) = y_{j,type} = \sum_{i=1}^{4 \text{ or } 6} Q_j(i) x_{j,type}(i) \quad (7)$$

by choosing from Table 3 the optimal code word for a certain type. The value determined can be obtained using the choice from Table 3 that minimizes (or otherwise reduces to a desirable level) Expression (7) and can be designated as a local cost for that code word type at its corresponding position. Conceptually, the local cost is a value indicative of how much a code word of a selected code word type impacts or alters the output of the channel when the code word is included in the test sequence.

At 1212, cumulative costs can be determined for the possible cord word types. In one implementation, for every code word at every position, a cumulative cost and its optimal predecessor can be determined. For example, in one particular implementation, this method act comprises performing a sweep from left to right (or right to left). For the first code word position considered (for example, the leftmost groups), the cumulative cost of each code word type is its own cost computed at 1210. For the next positions, i=2 . . . M, the cumulative cost of a code word type can be defined as a sum of its own local cost plus the smallest cumulative cost from its two available predecessors. At this point, the code word type representation stores an identity of its predecessor (or a pointer to it) having the smallest cumulative cost (for example, by marking it as the "best" candidate predecessor). Conceptually, the cumulative cost for a code word type representation is a value indicative of how much a sequence of code words that includes the local bit group and one or more sequentially related bit groups (if any) impacts or alters the output of the channel when the sequence of code words is included in the test sequence.

At 1214, once the initial sweep is complete, the code word type representations 522 in the last position will contain cumulative costs that are "global" for the full test sequence being generated. From the four available alternatives, the code word type representation with the smallest cost can be identified. In this exemplary implementation, this element will belong to the chain of code word type representations constituting the worst sequence. Because predecessors were marked for each code word type representation during computation of the cumulative costs, the chain of code words that led to that result can be restored at 1214. In this embodiment, the restored chain defines the worst case sequence.

Method acts 1210, 1212, 1214, can be repeated for other possible leading bit orientations. For example, the acts can be repeated for all the possible leading bit positions (or a subset thereof) in order to find better solutions, such as the globally optimal solution.

In the method acts 1210 and 1212, the local costs of predecessors may occasionally become equal. In such situations, and in certain implementations of the disclosed technology, any of the predecessors can be selected. This selection typically does not affect the quality of the worst case sequence but only indicates that there are several sequences that produce equally closed eye diagrams. If desired, the technique can be modified so that all such possible sequences are generated and considered.

In the following paragraphs, an exemplary application of methods acts 1210, 1212, and 1214 is described. Assume for purposes of this example that the inversed pulse response contains 20 samples with sample values as shown in Table 4. In Table 4, the leading (sample) value is shown in bold.

TABLE 4

Example Inverted Pulse Response Q(n)

| NN | Sample value |
|---|---|
| 1 | −0.08 |
| 2 | 0.11 |
| 3 | 0.16 |
| 4 | 0.09 |
| 5 | 0.01 |
| 6 | −0.07 |
| 7 | −0.10 |
| 8 | −0.13 |
| 9 | −0.06 |
| 10 | 0.02 |
| 11 | 0.05 |
| 12 | 0.10 |
| 13 | 0.12 |
| 14 | 0.04 |
| 15 | 1.27 |
| 16 | 0.15 |
| 17 | 0.03 |
| 18 | −0.07 |
| 19 | −0.16 |
| 20 | −0.08 |

For method act 1212, it can be observed that any code group $x_{i,type}$, standing in a position i and having the type type={nP6p, pN6n, nZ6n, pZ6p and nP4p, nZ4n, pN4n, pZ4p} can be replaced with another group from Table 1 having the same type, without any consequence from the disparity and running length rules.

FIG. 6 is a schematic block diagram 600 in the form of the diagram 500 in FIG. 5 and shows the result of method act 1212 for this example. Similar to FIG. 5, the schematic block diagram 600 includes a region 610 and pulse response groups 612. In particular, the code word type representations 622 in the code word region 620 show the selected code word (selected from Table 3) and the local cost of each selected code word. In this example, for each particular 6- or 4-bit portion of the response Q ($Q_i$, i=1 . . . 4) and each possible code word type (nPp, pNn, nZn or pZp), the word that makes the smallest local cost as defined by Expression (7) can be found from Table 3. For example, of the code words corresponding to response group $Q_i$=[−0.08, 0.11, 0.16, 0.09, 0.01, −0.07], the code word "100111" creates the smallest cost among words of type nPp and size 6. Remember that in Expression (7), a logical "1" means taking the value with sign "+" and logical "0" means taking the value with sign "−". Hence, the local cost for this word in this position is defined as:

$$\text{Cost}(1,nPn)=(-0.08)-(0.11)-(0.16)+(0.09)+(0.01)+(-0.07)=-0.32 \quad (8)$$

It is easy to verify that no other code word of this type and in this position gives a smaller cost.

In certain implementations, the response group that contains the "leading bit" is treated differently. In this example, assume that the leading bit (shown by frame 614) is the 5-th bit in the third pulse response group ($Q_3$). For this position, when looking for a word with the smallest cost, those without a logical "1" in the leading bit position are ignored. Note, for instance, that all code words corresponding to pulse response group $Q_3$ of this example have a logical "1" at the fifth bit.

At this point, method act 1212 is considered complete. The fragments of the worst case sequence are already defined, although alternatives may exist concerning how to combine the fragments together.

For method act 1214, it is known that each code word may have two different predecessors as was illustrated by FIG. 4. One of the predecessors, however, may have a smaller cumulative cost, defined as the sum of its own cost and the cumulative cost of its best predecessor.

The procedure of establishing the cumulative cost and best predecessors according to one exemplary implementation is illustrated by schematic block diagram 700 shown in FIG. 7. Block diagram 700 also has the form of the diagram 500 in FIG, including a region 710 and pulse response groups 712. Starting the process from left to right (though the procedure may similarly be performed from right to left or other sequences, with equally good results), for the leftmost code word type representations 722 in the code region 720 (corresponding to the pulse response group $Q_1$), the cumulative costs are defined (shown underlined and bolded) and are equal to their local costs (shown in parentheses). In the next column (second from the left and corresponding to the pulse response group Q2), the local cost is already known but not the cumulative cost. Each code word type representation may have two predecessors, as indicated by the arrows. However, in this exemplary implementation, the predecessor having the smallest cumulative cost is selected. According to one exemplary embodiment, the cumulative cost can be defined as:

$$\text{Cum. cost} = \text{local cost} + \text{cum. cost of the best predecessor.} \quad (9)$$

For example, the code word type representation nZn of size 4 in the second column (corresponding to response Q2) has a local cost of −0.19. It also has two predecessors: pNn in the first column (corresponding to response group Qi) with cumulative cost −0.52, and nZn in the first column with a cumulative cost −0.50. The first code word type representation (pNn) has the smallest cumulative cost. Therefore, it is marked as the best predecessor for the code word type representation nZn, and its cumulative cost is used to find the cumulative cost of the code word type representation nZn: cum. cost of (nZn, 2)=−0.19−0.52=−0.71. At the end of the sequence (here, at the fourth column corresponding to response group Q4), the final cumulative costs are determined.

At method act 1214, the smallest cumulative cost ("−0.28") is identified as belonging to the code word type representation nPp in the final column. The sequence order that led to this code word type representation can then be restored. The restoration process in the illustrated implementation is straightforward because the preferred predecessors have all been marked (for example, using pointers). FIG. 7 illustrates the preferred predecessors through undashed arrows. The chain of code word type representations producing the worst case sequence can therefore be restored with a reverse sweep (from right to left), which produces the following sequence:

$$pN6n \rightarrow nP4p \rightarrow pN6n \rightarrow nP4p$$

The bit content of the representations was already defined during method act 1212, as shown in FIG. 6. Combining the bits together, the following worst sequence is generated:

100001 1110 000110 0111

Note that this sequence represents the solution for a particular starting bit choice. The method acts 1212, 1214, 1216 can be repeated for multiple other starting positions in order to find a global solution. To do so, it may be necessary to add a few zero samples for alignment.

Exemplary Computing Environments

Figure 8:
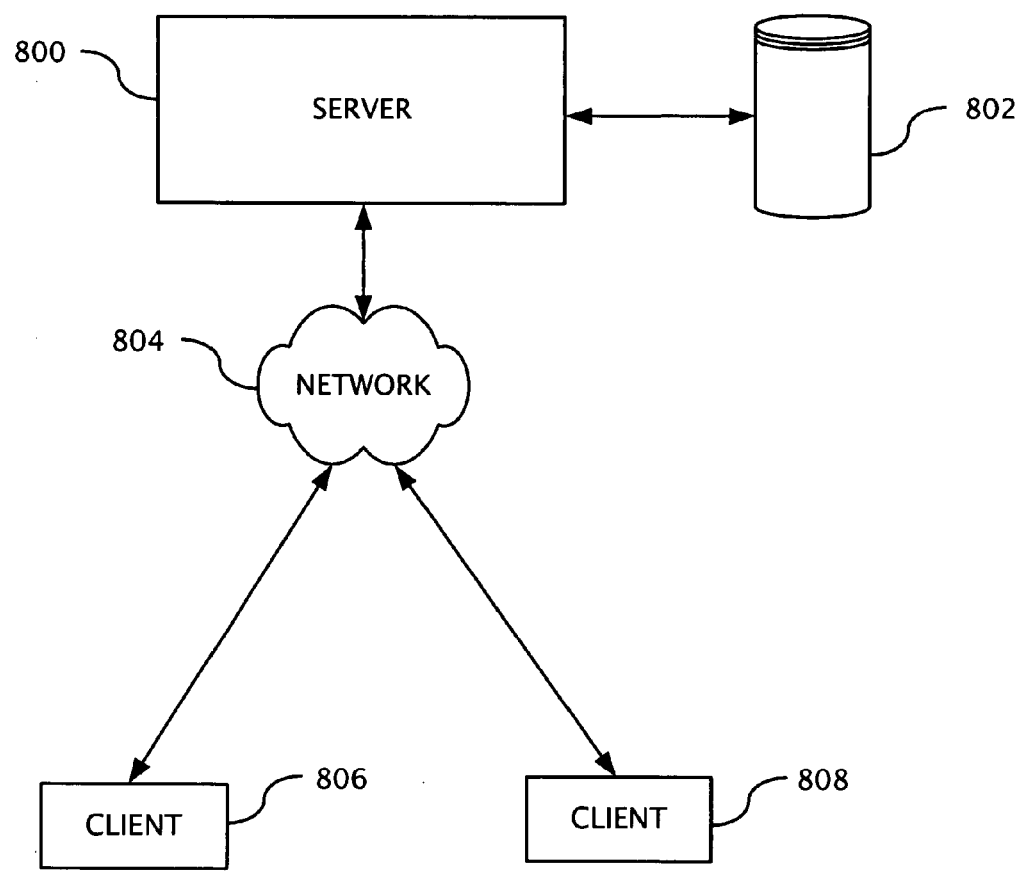
FIG. 8 is a schematic block diagram of a distributed computer network that can be used to perform any of the disclosed methods.

Any of the aspects of the technology described above may be performed using a distributed computer network. FIG. 8 shows one suitable exemplary network. A server computer 800 can have an associated storage device 802 (internal or external to the server computer). For example, the server computer 800 can be configured to generate test sequences using any of the disclosed methods (for example, as part of an EDA software tool, such as a signal integrity analysis tool). The server computer 800 can be coupled to a network, shown generally at 804, which can comprise, for example, a wide-area network, a local-area network, a client-server network, the Internet, or other suitable network. One or more client computers, such as those shown at 806, 808, may be coupled to the network 804 using a network protocol. The work may also be performed on a single, dedicated workstation, which has its own memory and one or more CPUs.

Figure 9:
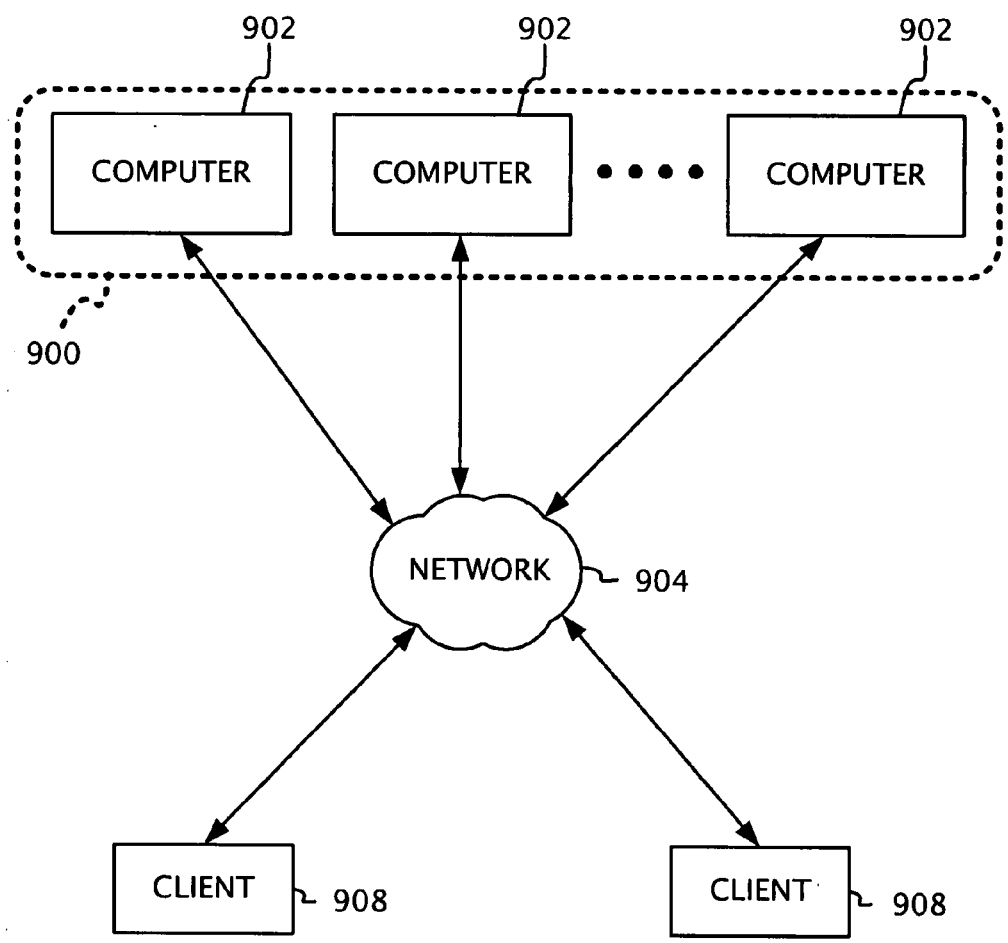
FIG. 9 is a schematic block diagram of another distributed computer network that can be used to perform any of the disclosed methods.

FIG. 9 shows another exemplary network. One or more computers 902 communicate via a network 904 and form a computing environment 900 (for example, a distributed computing environment). Each of the computers 902 in the computing environment 900 can be used to perform at least a portion of the sequence generating process. The network 904 in the illustrated embodiment is also coupled to one or more client computers 908.

Figure 10:
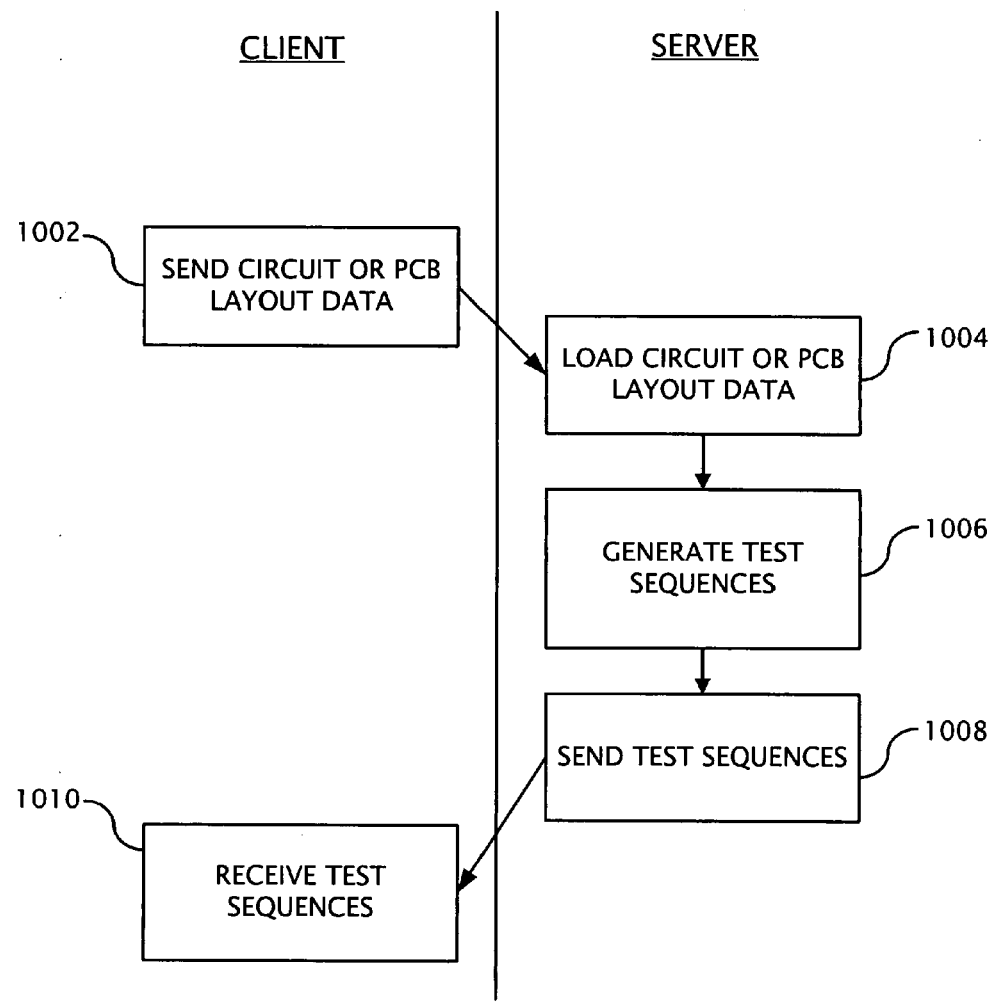
FIG. 10 is a flowchart showing an exemplary application of the computer networks of FIG. 8 or FIG. 9.

FIG. 10 shows that design information for a circuit or PCB design (for example, a PCB layout file (such as a .HYP file), an HDL file, netlist, GDSII file, Oasis file, or other suitable design file representing the circuit- or PCB-under-test) can be analyzed using a remote server computer (such as the server computer 800 shown in FIG. 8) or a remote computing environment (such as the computing environment 900 shown in FIG. 9) in order to generate a test sequence according to any of the disclosed embodiments. At process block 1002, for example, the client computer sends the design information to the remote server or computing environment. In process block 1004, the design information is received and loaded by the remote server or by respective components of the remote computing environment. In process block 1006, test sequence generation is performed according to any of the disclosed embodiments. At process block 1008, the remote server or computing environment sends the resulting test sequences to the client computer, which receives the data at process block 1010.

It should be apparent to those skilled in the art that the example shown in FIG. 1000 is not the only way to generate test sequences using multiple computers. For instance, the circuit or PCB design information may be stored on a computer-readable medium that is not on a network and that is sent separately to the server or computing environment (for example, a CD-ROM, DVD, or portable hard drive). Or, the server computer or remote computing environment may perform only a portion of the test sequence generation procedure.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. I therefore claim as my invention all that comes within the scope and spirit of these claims.

What is claimed is:

1. A method comprising:
   sampling, by a computing system, a response of a circuit channel to an input pulse;
   nonrandomly determining, by the computing system, a sequence of code words configured to comply with a transmission code for the circuit channel by:
   dividing the sampled pulse response for the circuit channel into bit groups,
   identifying possible code word types for the bit groups of the divided sampled pulse response, and
   selecting one of the possible code word types for each bit group to include in the sequence of code words based, at least in part, on the sampled pulse response of the circuit channel; and
   transmitting, by the computing system, the sequence of code words as input on the circuit channel, which causes the output voltage of the circuit channel to be reduced during a time period in which the circuit channel outputs a logic high value.

2. The method of claim 1, wherein the bit groups each include multiple bits and have lengths complying with the transmission code.

3. The method of claim 2, wherein the possible code word types for the bit groups of the divided sampled pulse response comply with the transmission code for the circuit channel.

4. The method of claim 3, wherein the act of nonrandomly determining the sequence comprises computing a value indicative of the impact a candidate code word has on reducing the output voltage of the circuit channel when the candidate code word is included in the sequence.

5. The method of claim 1, wherein the act of nonrandomly determining the sequence comprises computing a value indicative of the impact a subsequence of code words has on reducing the output voltage of the circuit channel when the subsequence of code words is included in the sequence.

6. The method of claim 2, wherein the act of nonrandomly determining the sequence comprises:
   evaluating a code word in the sequence; and
   selecting a sequence of code words to precede the code word from among multiple possible sequences of code words, the selection being based at least in part on the impact a respective one of the multiple possible sequences has on the output voltage of the circuit channel when the respective one of the multiple possible sequences is included in the sequence.

7. The method of claim 3, wherein the act of nonrandomly determining the sequence comprises:
   evaluating individual code words for possible inclusion in the sequence; and
   selecting one or more of the code words for inclusion in the sequence based at least in part on the effect the one or more of the code words have on the output voltage of the circuit channel when the code words are included in the sequence.

8. The method of claim 4, wherein the transmission code is the 8b10b transmission code.

9. The method of claim 5, wherein the sequence of code words is the worst case sequence.

10. The method of claim 1, wherein the sequence of code words minimizes an eye opening of an eye diagram that displays a representation of the circuit channel's response to the sequence of code words.

11. An apparatus including one or more computer-readable memory devices storing computer-executable instructions configured to cause a computer to perform operations comprising:
    nonrandomly determining a sequence of code words configured to comply with a transmission code for a circuit channel by:
    dividing a sampled pulse response for the circuit channel into bit groups,
    identifying possible code word types for the bit groups of the divided sampled pulse response, and
    selecting one of the possible code word types for each bit group to include in the sequence of code words based, at least in part, on a sampled pulse response of the circuit channel; and
    transmitting the sequence of code words as input on the circuit channel, which causes the output voltage of the circuit channel to be reduced during a time period in which the circuit channel outputs a logic high value.

12. The apparatus of claim 11, wherein the bit groups each include multiple bits and have lengths complying with the transmission code.

13. The apparatus of claim 12, wherein the possible code word types for the bit groups of the divided sampled pulse response comply with the transmission code for the circuit channel.

14. The apparatus of claim 11, wherein the act of nonrandomly determining the sequence comprises computing a value indicative of the impact a candidate code word has on reducing the output voltage of the circuit channel when the candidate code word is included in the sequence.

15. The apparatus of claim 12, wherein the act of nonrandomly determining the sequence comprises computing a value indicative of the impact a subsequence of code words has on reducing the output voltage of the circuit channel when the subsequence of code words is included in the sequence.

16. The apparatus of claim 13, wherein the act of nonrandomly determining the sequence comprises:
    evaluating a code word in the sequence; and
    selecting a sequence of code words to precede the code word from among multiple possible sequences of code words, the selection being based at least in part on the impact a respective one of the multiple possible sequences has on the output voltage of the circuit channel when the respective one of the multiple possible sequences is included in the sequence.

17. The apparatus of claim 14, wherein the act of nonrandomly determining the sequence comprises:
    evaluating individual code words for possible inclusion in the sequence; and
    selecting one or more of the code words for inclusion in the sequence based at least in part on the effect the one or more of the code words have on the output voltage of the circuit channel when the code words are included in the sequence.

18. The apparatus of claim 15, wherein the transmission code is the 8b10b transmission code.

19. The apparatus of claim 11, wherein the sequence of code words is the worst case sequence.

20. The apparatus of claim 12, wherein the sequence of code words minimizes an eye opening of an eye diagram that displays a representation of the circuit channel's response to the sequence of code words.

* * * * *